United States Patent [19]

Tsutsumi

[11] Patent Number: 5,629,632
[45] Date of Patent: May 13, 1997

[54] SYSTEM FOR TESTING ELECTRIC PROPERTIES OF AN OBJECT

[75] Inventor: Kenichi Tsutsumi, Yokohama, Japan

[73] Assignee: Tokyo Electron Limited, Japan

[21] Appl. No.: 614,743

[22] Filed: Mar. 13, 1996

[30] Foreign Application Priority Data

Mar. 14, 1995 [JP] Japan ................................ 7-081738

[51] Int. Cl.$^6$ ................................ G01R 1/02; B07C 5/36
[52] U.S. Cl. ........................................ 324/758; 324/754
[58] Field of Search ................................ 324/758, 765, 324/754, 158.1, 72; 209/571, 573, 905, 906; 414/225, 216, 404, 416; 901/40

[56] References Cited

U.S. PATENT DOCUMENTS

| | | | |
|---|---|---|---|
| 4,997,552 | 3/1991 | Schlinkmann et al. | 209/573 |
| 5,150,797 | 9/1992 | Shibata | 324/754 |
| 5,151,651 | 9/1992 | Shibata | 324/158 |
| 5,192,908 | 3/1993 | Shibata | 324/158 |
| 5,525,912 | 6/1996 | Momohara | 324/754 |

FOREIGN PATENT DOCUMENTS 2-272370  11/1990  Japan .

*Primary Examiner*—Vinh P. Nguyen
*Attorney, Agent, or Firm*—Graham & James LLP

[57] ABSTRACT

A tester system comprising first areas on which objects to be tested are mounted, a first movable alignment section for aligning objects, first and second tester units each having terminals connected to each object and serving to test electric properties of each object, a second movable alignment section for aligning the objects after they have been tested, second areas on which the objects are mounted after they have been tested, a loader for transferring a predetermined number of objects from the first areas to the first alignment section, a first carrier mechanism for holding the predetermined number of objects aligned on the first alignment section and transferring them to the first tester unit, connecting the object to the terminals of the first tester unit, and transferring the objects to the second alignment section, a second carrier mechanism for holding the predetermined number of objects aligned on the first alignment section and transferring them to the second tester unit, connecting the object to the terminals of the second tester unit, and transferring the objects to the second alignment section, an unloader for transferring the predetermined number of tested objects aligned on the second alignment section to the second areas.

10 Claims, 5 Drawing Sheets

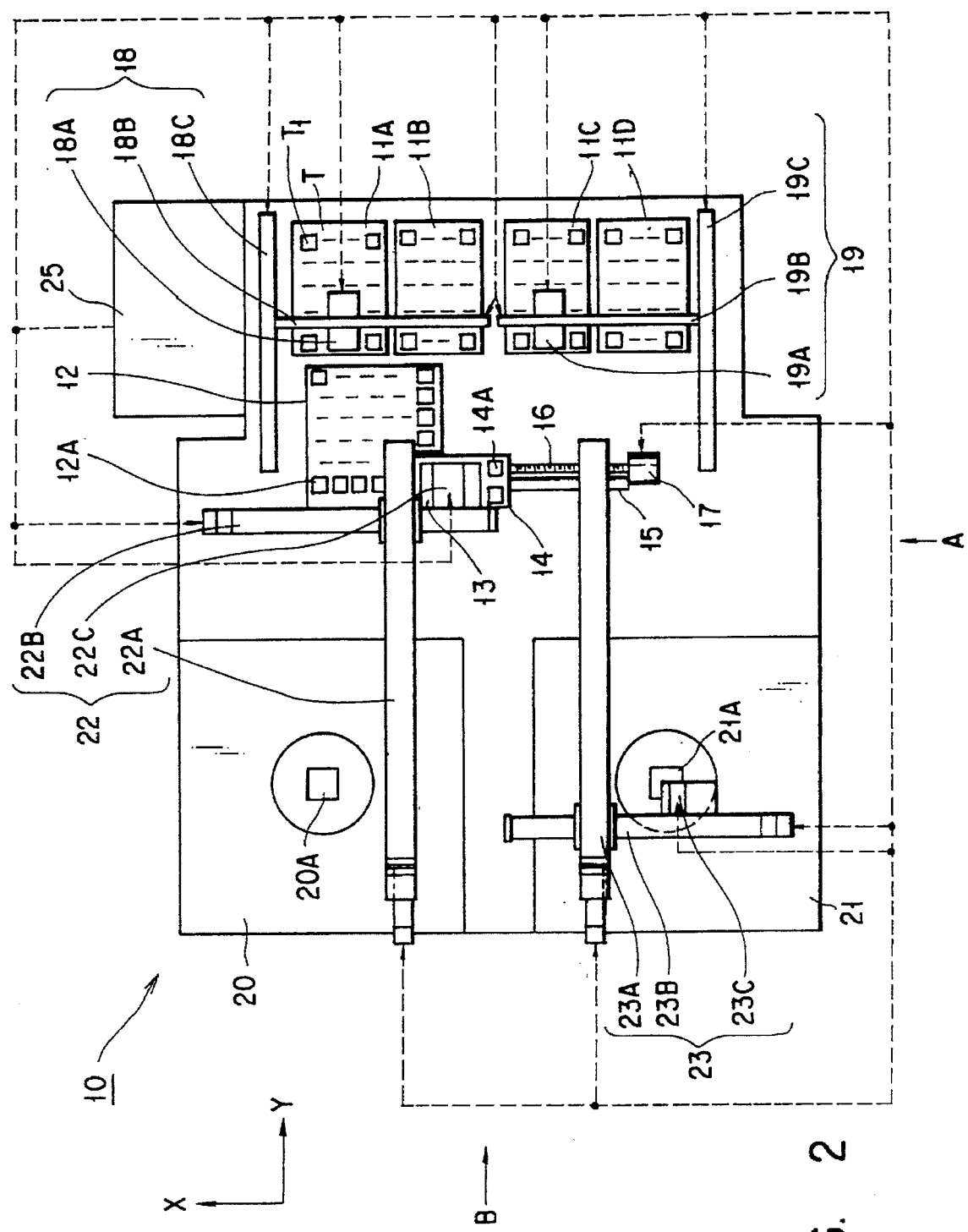
F I G. 2

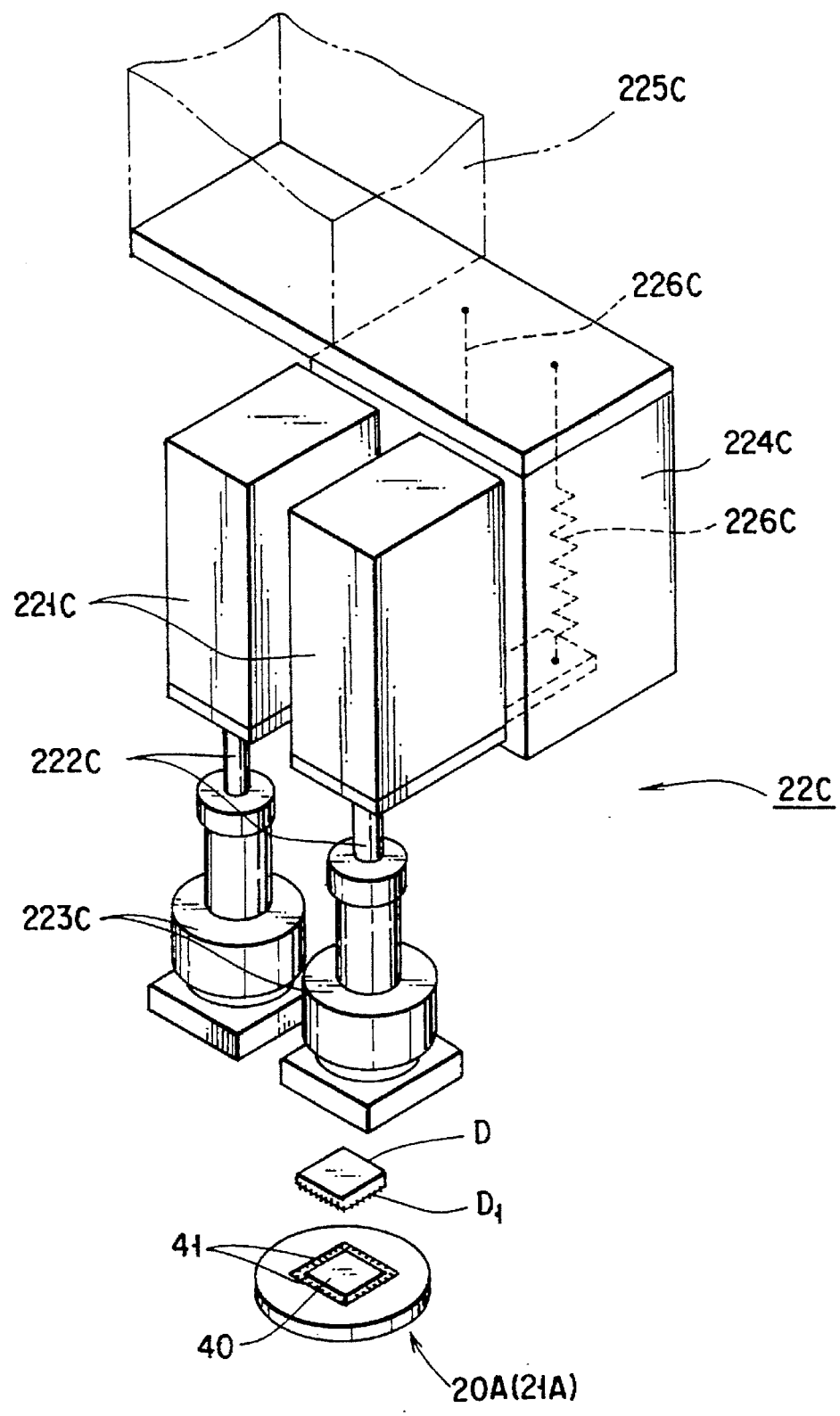
F I G. 5

SYSTEM FOR TESTING ELECTRIC PROPERTIES OF AN OBJECT

BACKGROUND OF THE INVENTION

1. Field of the Invention

The present invention relates to a system for testing electric properties of objects such as packaged logic circuit elements.

2. Description of the Related Art

Before being put on the market as a product, each of packaged elements or devices is tested about its electric properties. When the pitch of lead terminals of each device is relatively large, a tester system provided with a handler for handling devices and a test head for testing them is usually used in the test of this kind. According to this tester system, devices are automatically carried and attached to a socket of the test head by the handler and tested while electrically contacting lead terminals of the devices with electrodes of the test head via the socket. According to test results thus obtained, the devices are sorted and stored by the handler.

Conventional one of these tester systems is shown in FIG. 6. It has sections 1A–1D, on which plural trays are mounted, on its front (or upper) side. These tray-mounted sections 1A–1D are arranged on it along a direction X in FIG. 6. A tray T on which devices D to be tested are arranged in lines is mounted on each of the tray-mounted sections 1A and 1B, while a tray T on which devices D tested are arranged in lines is mounted on each of the tray-mounted sections 1C and 1D. A loader 2 and an unloader 3 which serve as the handler are arranged above an area in which the tray-mounted sections 1A–1D are included. The loader 2 serves to suck and hold four devices D from each of the trays T on the tray-mounted sections 1A and 1B and carry them to an supply section 5 which is on a devices-carrying line. The devices D at the supply section 5 are then carried to a test position, where a socket 7 of the test head is located, by a carrier mechanism 6, which sucks and holds four devices D from the supply section 5 at the same time and the carries them to the test position in this case. Those devices D which have been carried to the test position by the carrier mechanism 6 are attached to the socket 7 one by one and their electric properties are then tested through the test head. After the test, the carrier mechanism 6 carries them to a housing or storing section 8 which is in the operation area of the unloader 3. The unloader 3 sucks and holds four devices D tested from the housing section 8 at the same time and carries them to one of the trays T at the tray-mounted sections 1C and 1D while sorting them responsive to their test results obtained. To add more, the supply alignment section 5 serves to previously and correctly position or align each of them relative to the socket 7, while the housing alignment section 8 serves to previously and correctly position or align them relative to each of the trays T.

In order to increase the throughput of the test, it is usually necessary to shorten the index time (i.e., a period between the end of testing of devices D and the start of testing of next devices D moved to the test position after tested devices D have been removed from the test position). In the case of the conventional tester system shown in FIG. 6, therefore, four devices are carried to the test position at the same time, as described above. The average carrying time for each device is thus shortened, which leads to the shortening of the index time.

In the conventional tester system, however, one test head is provided with only one carrier mechanism 6. Even though the carrier mechanism 6 can carry plural devices D at the same time, each of them cannot be tested while the carrier mechanism 6 is moving. The test head is therefore left inoperative while devices D are being carried by the carrier mechanism 6. This makes it impossible to make the index time zero, thereby preventing the index time from being shortened.

Two test heads can be used to shorten the index time. In the conventional tester system, however, the test head is arranged to correspond to one handler. When two test heads are used in this case, therefore, two-line handlers are needed. This makes the tester system in FIG. 6 larger in size. Its installing space must be thus made larger and its making cost becomes higher, accordingly. Particularly in the logic test, contents of test become more complicated and test time also becomes longer, because objects such as logic circuit elements to be tested become larger in size and more complicated. This makes it difficult to increase the throughput.

SUMMARY OF THE INVENTION

A first object of the present invention is to provide a tester system capable of being made so more compact in size as to enable a handler of one line to correspond to two test heads and also capable of increasing the throughput to a greater extent while making the index time zero.

A second object of the present invention is to provide a tester system capable of increasing the throughput to a by far greater extent, particularly when logic test is to be conducted, and also capable of making test head operation life longer to increase test efficiency.

These objects of the present invention can be achieved by a tester system comprising first areas on which objects to be tested are mounted; a first movable alignment section for aligning objects to be tested; first and second tester means each having terminals electrically connected to each object and serving to test electric properties of each object to be tested, while electrically contacting its terminals with each object; a second movable alignment section for aligning the objects after they have been tested; second areas on which the objects are mounted after they have been tested; a loader for transferring a predetermined number of objects from the first objects-mounted areas to the first alignment section; a first carrier mechanism for holding the predetermined number of objects aligned on the first alignment section and transferring each of them to the first tester means, electrically and individually connecting the object thus transferred to the terminals of the first tester means, and transferring the objects to the second alignment section after the testing of all objects held is finished; a second carrier mechanism for holding the predetermined number of objects aligned on the first alignment section and transferring each of them to the second tester means without interfering with the first carrier mechanism, electrically and individually connecting the object thus transferred to the terminals of the second tester means, and transferring the objects to the second alignment section, without interfering with the first carrier mechanism, after the testing of all objects held is finished; an unloader for transferring the predetermined number of tested objects aligned on the second alignment section to the second objects-mounted areas; and a control means for controlling the first and second carrier mechanisms.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a plan view schematically showing the tester system;

FIG. 5 is a perspective view showing a suction holder of the carrier mechanism in the tester system.

DETAILED DESCRIPTION OF THE PREFERRED EMBODIMENT

The tester system according to an embodiment of the present invention and serving to test objects such as packaged semiconductor circuit devices (which will be hereinafter referred to as devices) will be described with reference to the accompanying drawings.

Figure 1:
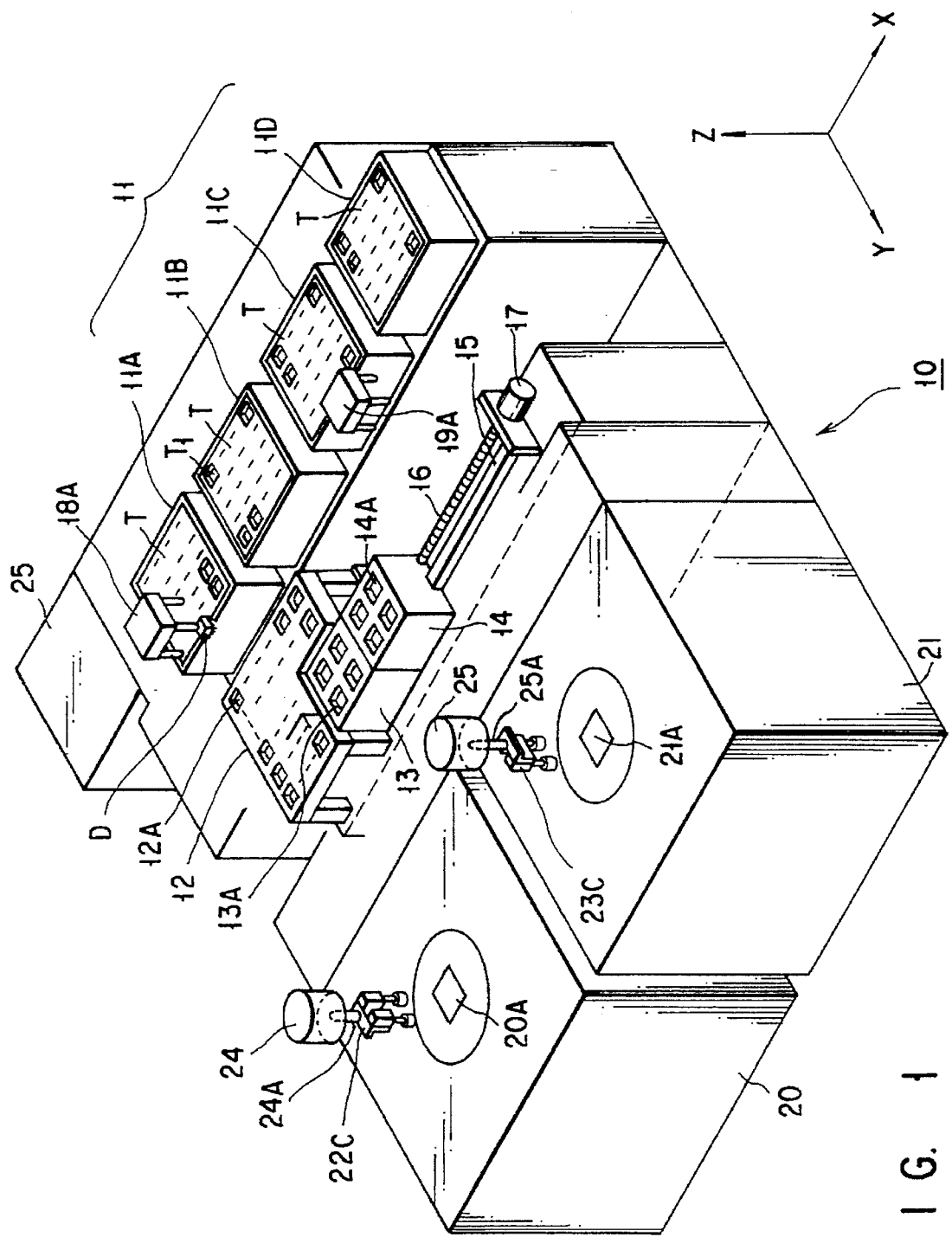
FIG. 1 is a perspective view schematically showing the tester system according to an embodiment of the present invention.

FIG. 1 shows a tester system 10 of the present invention. A section 11 on which semiconductor devices D are mounted is arranged on the front side of the tester system 10 and along a direction X. It includes four tray-mounted areas 11A–11D which are arranged in the direction X. Each of the tray-mounted areas 11A–11D can hold plural trays T, and the trays T held in the tray-mounted area can be moved up and down to a predetermined position in a direction Z by a lift 30 (see FIG. 3).

The lift 30 comprises a tray holder 11', a drive motor 33, a control box 34 and a guide shaft 35. The tray holder 11' can move up and down along the guide shaft 35, while holding a tray T, when driven by the drive motor 33. The control box 34, which can be replaced by a controller 25, incorporates a circuit board and controls the drive motor 33.

Each tray T has a plurality of recesses T1 in lines in which devices D are housed. Devices D to be tested are mounted on two left tray-mounted areas 11A and 11B while devices D tested are mounted on two right tray-mounted areas 11C and 11D after being sorted according to their test results.

A pre-heating section 12 is arranged on the rear side of the tray-mounted section 11 when viewed in a direction Y. Devices D picked up from the tray-mounted areas 11A and 11B are temporarily placed and pre-heated on the pre-heating section 12. The pre-heating section 12 has a plurality of recesses 12A in lines in which devices D are held and housed horizontally.

Supply and housing alignment sections 13 and 14 are arranged on the right side of the pre-heating section 12 when viewed in the direction X. Each of them has four recesses 13A or 14A, for example, in which devices D are held and housed horizontally. They are engaged with a guide rail 15, which extends in the direction X, and a ball screw 16, which is rotated by a drive means 17. They can therefore slide along the guide rail 15 in the direction X when the ball screw 16 is rotated. The drive means 17 is a pulse motor, for example, which is controlled by the controller 25.

A loader 18 is arranged above an area in which the tray-mounted areas 11A, 11B, the pre-heating section 12 and the alignment sections 13, 14 are included, and it carries devices D to and out of them. An unloader 19 is also arranged above another area in which the tray-mounted areas 11C, 11D and the alignment sections 13, 14 are included, and it carries devices D to and out of them.

As shown in FIG. 2, the loader 18 comprises a suction holder 18A capable of sucking and holding four devices D, which are to be tested, at the same time and being moved up and down in the direction Z, a ball screw 18B for driving the suction holder 18A in the direction X, and another ball screw 18C connected to an end of the ball screw 18B to drive it in the direction Y. The suction holder 18A itself can move in the direction Z and it is also reciprocated in directions X and Y by the ball screws 18B and 18C.

As shown in FIG. 2, the unloader 19 comprises a suction holder 19A capable of sucking and holding four tested devices D at the same time and being moved up and down in the direction Z, a ball screw 19B for driving the suction holder 19A in the direction X, and another ball screw 19C connected to an end of the ball screw 19B to drive it in the direction Y. The suction holder 19A itself can move in the direction Z and it can also be reciprocated in directions X and y by the ball screws 19B and 19C.

The ball screws 18B, 18C, 19B, 19C and the suction holders 18A, 19A are controlled by the control means 25. Each of the ball screws 18B, 18C, 19B and 19C is housed in a case. They, therefore, take an appearance of case in FIGS. 2 and 3.

Figure 3:
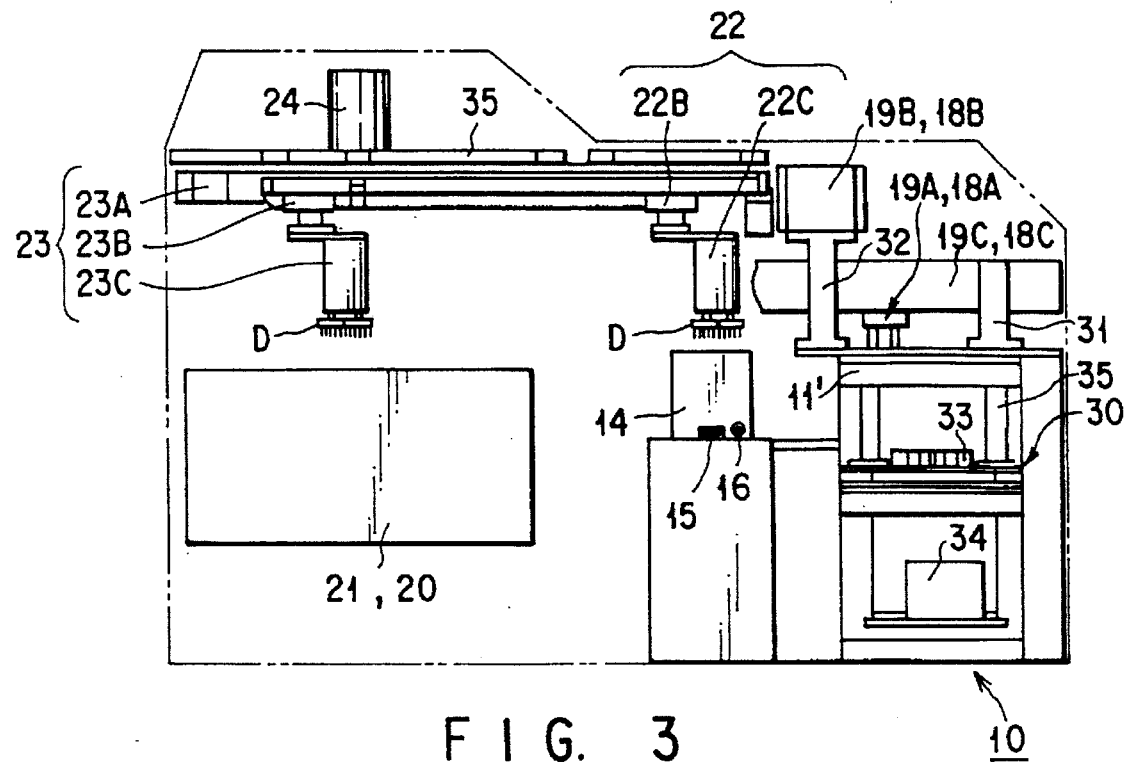
FIG. 3 is a side view showing the tester system viewed in a direction A in FIG. 2.

The ball screws 18B, 18C, 19B and 19C supported by posts 31 and 32 as shown in FIG. 3.

As shown in FIGS. 1 and 2, two test heads, first 20 and second 21, are arranged on the left of the pre-heating section 12 and the alignment sections 13, 14 when viewed in the direction Y. First and second sockets 20A and 21A which are electrically contacted with devices D are arranged on the tops of the test heads 20 and 21. As shown in FIG. 5, each of the first and second sockets 20A and 21A has an electrode 41 along the rim of a device-mounted area 40 to electrically connect lead terminals D1 of the device D to the test head below to test the electric properties of the device D.

First and second carrier mechanisms 22 and 23 are provided to carry devices D, which are to be tested, from the supply alignment section 13 to each of the test heads 20 and 21, and those devices D, which have been tested, from each of the test heads 20 and 21 to the housing alignment section 14. The first carrier mechanism 22 extends from the operation area of the alignment sections 13 and 14 to the rear (or left) end of the first test head 20 to carry the devices D between them. The second carrier mechanism 23 extends from the operation area Of the alignment sections 13 and 14 to the rear (or left) end of the second test head 21 to carry the devices D between them. The first and second carrier mechanisms 22 and 23 have a same structure and they are arranged symmetrical relative to each other when viewed in the direction Y.

The first carrier mechanism 22 has a ball screw 22A extending from above the moving area of the alignment sections 13 and 14 to above the rear (or left) end of the first test head 20 in the direction Y, another ball screw 22B connected to the ball screw 22A by nuts (not shown) and extending in the direction X, and a suction holder 22C connected to the ball screw 22B by nuts (not shown). The suction holder 22C can move along the ball screws 22A and 22B in directions X and Y. The second carrier mechanism 23 includes a ball screw 23A extending from above the moving area of the alignment sections 13 and 14 to above the rear (or left) end of the second test head 21 in the direction Y, another ball screw 23B connected to the ball screw 23A by nuts (not shown) and extending in the direction X, and a suction holder 23C connected to the ball screw 23B by nuts (not shown). Those passages through which the suction holder 23C is moved in directions X and Y are formed by the ball screws 23A and 23B. Therefore, the suction holders 22C and 23C can be reciprocated in the direction X by the direction-X ball screws 22b and 23B while in the direction Y by the direction Y ball screws 22A and 23A.

Figure 4:
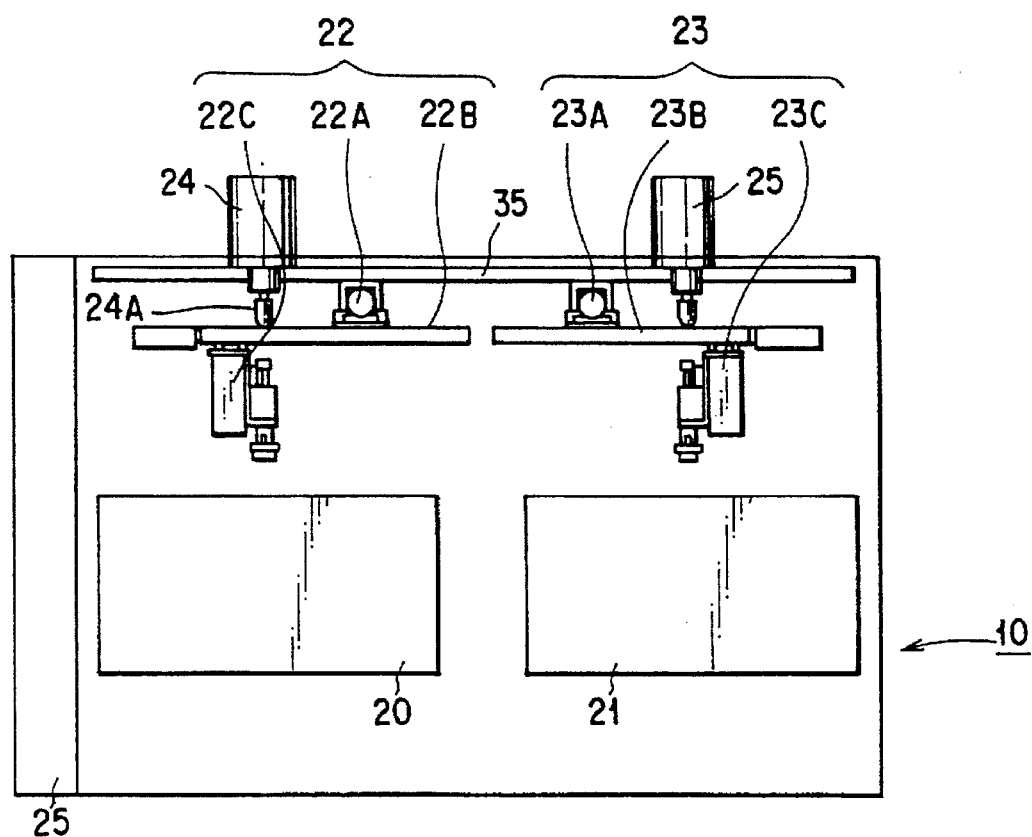
FIG. 4 is a side view showing the tester system viewed in a direction B in FIG. 2.

Each of the direction-X ball screws 22B and 23B has a certain length not to cause the suction holders 22C and 23C to interfere with each other when they move along the direction-Y ball screws 22A and 23A in the direction Y. They can thus reciprocate in directions X and Y, without interfering with each other, to carry devices D, which are to be tested, from the supply section 13 to the first and second test heads 20 and 21 and devices D, which have been tested, from the first and second test heads 20 and 21 to the housing section 14. The ball screws 22A, 22B, 23A and 23B are housed in cases. They, therefore, takes an appearance of case in FIGS. 2 through 4.

FIG. 5 shows a structure of the suction holder 22C in more detail. Another suction holder 23C will be cited only when needed because it has same structure as the suction holder 22C.

As shown in FIG. 5, the suction holder 22C comprises two air cylinders 221C and 221C vertically erected, cylinder rods 222C and 222C passed through the air cylinders and moved up and down by air pressure supplied to the air cylinders 221C and 221C, and suction bodies 223C and 223C connected to lower ends of the cylinder rods 222C and 222C. The air cylinders 221C and 221C house buffer springs (not shown) therein to urge the cylinder rods 222C and 222C downwards. Each of the suction bodies 223C and 223C has a bottom suction face, in which a vacuum suction hole is formed, and houses a heater therein.

The air cylinders 221C and 221C are connected to an urging mechanism 224C, in which two tension springs 226C and 226C connected to the air cylinders 221C and 221C are housed. When the air cylinders 221C and 221C are released from a state under which they are forced downwards against their tension springs 226C and 226C, their tension springs 226C and 226C cause them to be automatically returned to their original upper positions by the restoring force of the springs 226C and 226C. In FIG. 5, numeral reference 225C denotes a member through which the suction holder 22C is attached to the direction-X ball screw 22B.

As shown in FIG. 1, a push mechanism 24 is arranged just above the first socket 20A of the first test head 20 to push the air cylinder 221C of the suction holder 22C downwards. It is supported by a support 35 of the system 10 and its rod 24A pushes the air cylinders 221C and 221C downwards and independently of the other to electrically contact that device D, which is held by the suction body 223C, with the first socket 20A. Similarly, another push mechanism 25 is also arranged just above the second socket 21A of the second test head 21 to push the air cylinder of the suction holder 23C. It is also supported by the support 35 of the system 10 and its head 25A pushes the air cylinders of the suction holder 23C downwards and independently of the other to electrically contact the device D, which is held by the suction body, with the second socket 21A. After the devices D are tested, the push mechanisms 24 and 25 move their rods 24A and 25A upwards to release the air cylinders 221C of the suction holders 22C and 23C. The air cylinders 221C and 221C are thus urged upwards by the tension springs 226C and 226C of the urging mechanism 224C to thereby release the devices D from the first and second sockets 20A and 21A.

The ball screws 22A, 22B, 23A, 23B and the push mechanism 24 are controlled by the control means 25. The supply of air to the air cylinders 221C and 221C is also controlled by the control means 25.

It will be described how the above-described tester system 10 is operated. Devices D which are to be tested and which are arranged on trays T are carried to the tray-mounted areas 11A and 11B of the section 11. When a predetermined number of devices D which are to be tested are arranged at the tray-mounted areas 11A and 11B, the suction holder 18A of the loader 18 is moved to the tray-mounted area 11A or 11B along the ball screws 18B and 18C. It sucks and held four devices D together from the tray T on the tray-mounted area 11A or 11B and carries them to the recesses 12A in the top of the pre-heating section 12. The devices D are thus arranged and pre-heated in lines in the pre-heating section 12.

After this pre-heating, four devices D are carried from the pre-heating section 12 to the supply alignment section 13 by the loader 18. When they are carried to the supply alignment section 13, the first carrier mechanism 22 is driven and two of them which are arranged in the supply alignment section 13 in the direction Y are sucked and held by the suction holder 22C and carried to the first test head 20. When the first carrier mechanism 22 is driven, the suction holder 22C is moved along the direction-Y and -X ball screws 22A and 22B in directions X and Y and to above the devices D on the supply alignment section 13. The suction bodies 223C and 223C are then moved downwards together with the cylinder rods 222C and 222C by air pressure supplied into two air cylinders 221C and 221C of the suction holder 22C and two devices D which are arranged in the supply alignment section 13 in the direction Y are vacuum-sucked by the suction bodies 223C and 223C. When the devices D are sucked and held by the suction bodies 223C and 223C, the suction bodies 223C and 223C are moved upwards to their original positions together with the cylinder rods 222C and 222C by air pressure supplied into the two air cylinders 221C and 221C.

While holding two devices D, the suction holder 22C is then moved to the first test head 20 along the direction-Y and -X ball screws 22A and 22B. One of the devices D held by the suction holder 22C is positioned to come just above the first socket 20A of the first test head 20 by the ball screws 22A and 22B operated. When this positioning is finished, the suction body 223C is moved downwards together with the cylinder rod 222C by air pressure supplied into the air cylinder 221C, while the rod 24A of the push mechanism 24 is moved down to push down the air cylinder 221C against the tension spring 226. The one device D sucked and held by the suction body 223C is thus attached to the first socket 20A to electrically connect lead terminals D1 of the device D with the electrode 41 which is arranged along the rim of the device-mounted section 40.

When the lead terminals D1 of the device D are connected to the electrode 41, electric properties of the device D are tested by the first test head 20. When this testing of electric properties is finished about the device D, the rod 24A of the push mechanism 24 moves up. The air cylinder 221C is returned this time to its original upper position by the restoring force of the tension spring 226C of the urging mechanism 224C, while the suction body 223C is moved upwards together with the cylinder rod 222C by air pressure supplied into the air cylinder 221C. The direction-Y ball screw 22A is then driven and the other remaining device D which is held by the suction holder 22C and which is to be tested is positioned to come just above the socket 20 and its electric properties are then tested by the same steps as described above.

When the testing of two devices D is finished in this manner, the first carrier mechanism 22 is driven to carry the two devices D, which have been tested, to the housing alignment section 14. The housing alignment section 14 is slid this time along the guide rail 15 by the ball screw 16 and kept waiting at a position where the devices D which have been tested and which are carried by the first carrier mechanism 22 can be housed.

While the devices D are carried by the first carrier mechanism 22 and tested, the second carrier mechanism 23 is driven similarly to the first one to suck and hold the other two remaining devices D from the supply alignment section 13 and carry them to the second test head 21. At the same time when the testing of the two devices D carried by the first carrier mechanism 22 is all finished, the second carrier mechanism 23 attaches the one device D, which is sucked and held by the suction holder 23C, to the socket 21A of the second test head 21 to test it.

When the first carrier mechanism 22 houses the devices d into the housing alignment section 14, it moves the suction holder 22C to the supply alignment section 13 along the direction-X ball screw 22B and sucks and holds next devices D from the section 13 to carry them to the first test head 20 as described above. The testing of the devices D by the second test head 21 is finished during this while and the devices D which have been tested are carried to the housing alignment section 14 by the second carrier mechanism 23. At the same time when the testing of the two devices D carried by the second carrier mechanism 23 is all finished, the first carrier mechanism 22 attaches the one device D, which is sucked and held by the suction holder 22C, to the socket 20A of the first test head 20 to test it.

While a series of operations such as the device-carrying by the first and second carrier mechanisms 22 and 23 and the device-testing by the first and second test heads 20 and 21 are being conducted, the loader 18 carries devices, which are next to be tested, from the pre-heating section 12 to the supply alignment section 13 to make them ready for testing. In addition, it adds devices D from the tray T to the pre-heating section 12, if necessary. To the contrary, the unloader 19 sorts the devices D, which are carried to the housing alignment section 14 by the carrier mechanism 22, 23, as being good or not good according to their test results to house good products into the tray-mounted area 11C, for example, and not-good ones into the tray-mounted area 11D.

A series of the above-described operations (or operation timings) are controlled by the control means 25 in such a way that the first and second test heads 20, 21 can be used without keeping them unoccupied.

According to the above-described tester system 10 of the present invention, the first and second carrier mechanisms 22 and 23 are provided to correspond to the first and second test heads 20 and 21 and devices D are carried one by one to the sockets 20A and 21A of the first and second test heads 20 and 21 without causing the suction holders 22C and 23C to interfere with each other. After the testing by the first test head 20 is finished, therefore, it can be conducted, without losing any time, by the second test head 21. The index time of devices D can be thus made zero, thereby enhancing the throughput to a greater extent, as compared with conventional cases. In addition, the operative time of the tester system can be made longer to increase the efficiency of testing the devices D.

Figure 6:
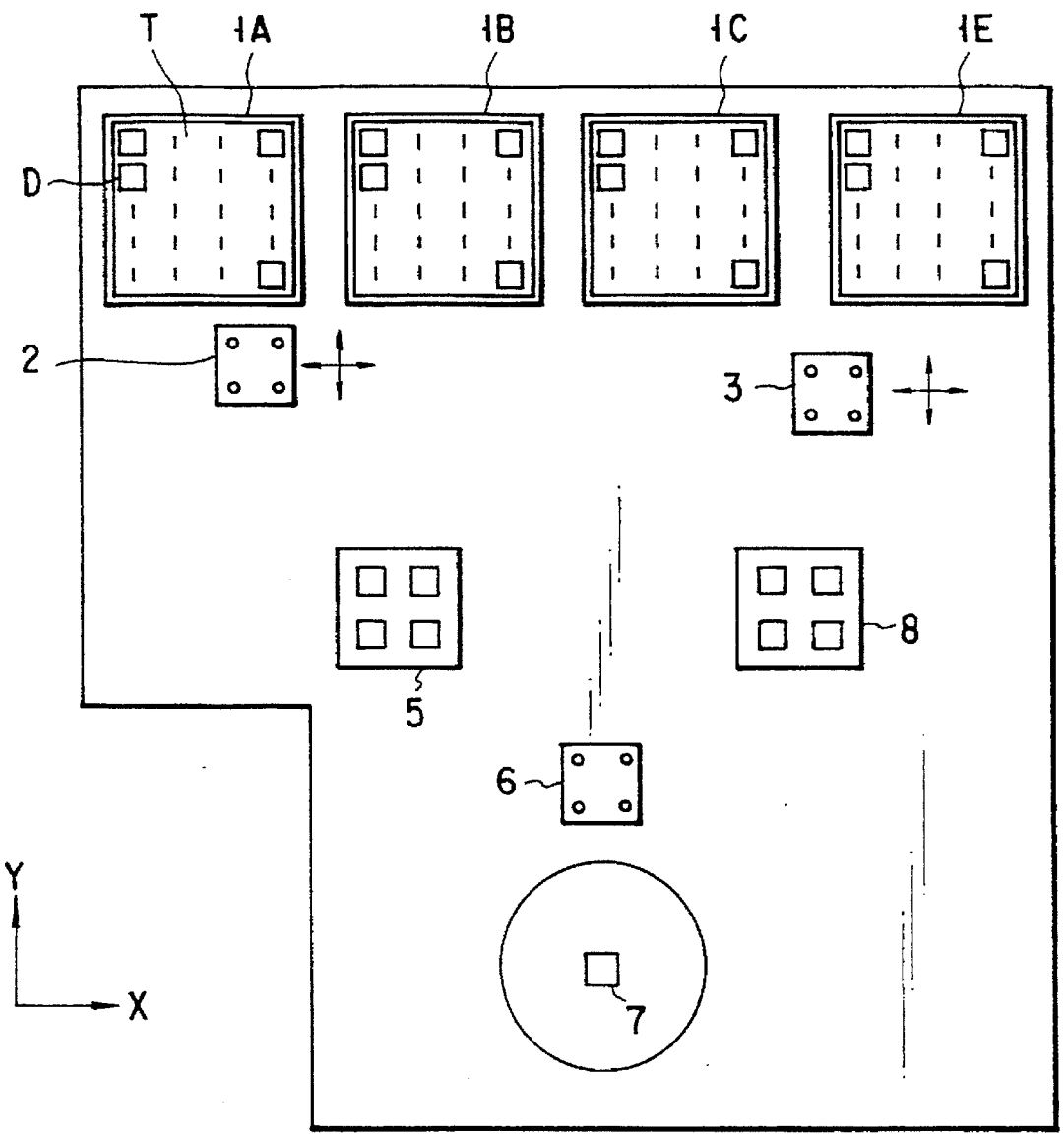
FIG. 6 is a plan view schematically showing a conventional tester system.

Further, the tester system 10 of the present invention can correspond to two of the conventional ones even though the loader/unloader 18 and 19 of one line are provided to cover the two first and second test heads and a carrier mechanism of one line is only added. When logic circuit elements such as CPU are to be tested in the conventional cases, two test heads must be provided to shorten the index time because the test head is related to one handler. When two test heads are provided, handlers of two lines are needed. This causes the installing space to be made larger. In the tester system 10 of the present invention, however, a carrier mechanism and a test head are only added to the conventional tester system shown in FIG. 6, while keeping the loader/unloader mechanism to be of one line. Even if constructed like this, the tester system 10 can correspond to two of the conventional ones. The index time can be shortened to such a greater extent that could not be realized by the conventional tester system shown in FIG. 6. The tester system 10 is therefore extremely useful in that the index time can be shortened to a greater extent, that the system can be made more compact in size, and that the system does not need any space so large that two conventional tester systems occupy.

Although ball screws have been used for the first and second carrier mechanisms 22 and 23 and also for the direction-X and -Y drive mechanisms in the above-described tester system 10, they may be belt mechanisms, for example, capable of carrying objects, which are to be tested, in directions X and Y. In addition, the drive mechanism in the direction Z is not limited to the air cylinder.

Further, although devices D have been successively tested by using two test heads alternately in the tester system 10, two test heads may be made operative at the same time to achieve parallel processes.

Still further, although first and second sockets 20A and 21A have had a same structure in the tester system 10, they may be different in structure to test devices of different kinds. If devices of different kinds can be tested, the tester system 10 can be more useful because the testing of two kinds of device D can be conducted parallel to each other by one tester system 10.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A tester system comprising
first areas on which objects to be tested are mounted;
a first movable alignment section for aligning objects to be tested;
first and second tester means each having terminals electrically connected to each object and serving to test electric properties of each object to be tested, while electrically contacting its terminals with each object;
a second movable alignment section for aligning the objects after they have been tested;
second areas on which the objects are mounted after they have been tested;

a loader for transferring a predetermined number of objects from the first areas to the first alignment section;

a first carrier mechanism for holding the predetermined number of objects aligned on the first alignment section and transferring them to the first tester means, electrically and individually connecting the object thus transferred to the terminals of the first tester means, and transferring the objects to the second alignment section after the testing of all objects held is finished;

a second carrier mechanism for holding the predetermined number of objects aligned on the first alignment section and transferring them to the second tester means electrically and individually connecting the object thus transferred to the terminals of the second tester means, and transferring the objects to the second alignment section after the testing of all objects held is finished;

an unloader for transferring the predetermined number of tested objects aligned on the second alignment section to the second areas; and control means for controlling the first and second carrier mechanisms.

2. The tester system according to claim 1, wherein said control means controls operations of the first and second carrier mechanisms in such a way that the testing of objects carried by one of the first and second carrier mechanisms can be started at the same time when the testing of objects carried by the other of them is finished.

3. The tester system according to claim 1, wherein said control means controls operations of the first and second carrier mechanisms in such a way that the first and second tester means can continuously conduct their testing of objects to be tested.

4. The tester system according to claim 1, wherein each of the first and second carrier mechanisms has a holding body provided with holders capable of holding the objects to be tested, and means for moving the holding body between above the first or second alignment section and above the terminals of the first or second tester means.

5. The tester system according to claim 4, wherein each of the first and second carrier mechanisms has a push mechanism for pushing down the holding body, which has been positioned above the terminals of the first or second tester means, to electrically connect the object, which is held by each holder of the holding body, to the terminals of the first or second tester means.

6. The tester system according to claim 4, wherein said moving means comprises a first guide section for supporting the holding body and moving it along passages of the first and second alignment sections and a second guide section for guiding the first guide section to above the terminals of the first or second tester means.

7. The tester system according to claim 6, wherein said first and second guide sections are made by ball screws.

8. The tester system according to claim 1, wherein said first and second tester means test electric properties of each of objects which are of different kinds.

9. The tester system according to claim 1, wherein said object to be tested is a logic circuit element.

10. The tester system according to claim 1, wherein said first and second alignment sections are moved along a same guide rail.

* * * * *